(12) United States Patent
Shi et al.

(10) Patent No.: US 8,130,809 B2
(45) Date of Patent: Mar. 6, 2012

(54) OPTOELECTRONIC DEVICE HAVING LIGHT SOURCE EMITTER AND RECEIVER INTEGRATED

(75) Inventors: Jin-Wei Shi, Taoyuan County (TW); Fong-Ming Kuo, Taoyuan County (TW)

(73) Assignee: National Central University, Taoyuan County (TW)

( * ) Notice: Subject to any disclaimer, the term of this patent is extended or adjusted under 35 U.S.C. 154(b) by 230 days.

(21) Appl. No.: 12/703,607

(22) Filed: Feb. 10, 2010

(65) Prior Publication Data

US 2011/0164645 A1 Jul. 7, 2011

(30) Foreign Application Priority Data

Jan. 7, 2010 (TW) .................................. 99100249

(51) Int. Cl.
*H01S 5/00* (2006.01)
(52) U.S. Cl. ............... 372/50.21; 372/50.124; 372/50.11
(58) Field of Classification Search ............... 372/50.21, 372/50.124, 50.11
See application file for complete search history.

(56) References Cited

U.S. PATENT DOCUMENTS 6,687,268 B2 * 2/2004 Kitamura et al. ................ 372/22
7,738,522 B2 * 6/2010 Henrichs ..................... 372/43.01

* cited by examiner

*Primary Examiner* — Kinam Park
(74) *Attorney, Agent, or Firm* — Jackson IPG PLLC; Demian K. Jackson

(57) ABSTRACT

An optoelectronic device is provided. A light source emitter and a light source receiver are integrated in the device. The light source emitter is a Zn-diffused vertical cavity surface-emitting laser (VCSEL). The light source receiver is a uni-traveling-carrier photodiode (UTC-PD). With the VCSEL, a 10 Gb/s eye is opened under a small voltage and a small signal amplitude. With the UTC-PD, the 10 Gb/s eye is passed even under zero-bias. Thus, the optoelectronic device has a high speed and power consumption is saved.

13 Claims, 7 Drawing Sheets

OPTOELECTRONIC DEVICE HAVING LIGHT SOURCE EMITTER AND RECEIVER INTEGRATED

TECHNICAL FIELD OF THE DISCLOSURE

The present disclosure relates to an optoelectronic device; more particularly, relates to integrating a high-speed uni-traveling-carrier photodiode (UTC-PD) and a zinc-diffused vertical cavity surface-emitting laser (VCSEL) for high speed and low power consumption.

DESCRIPTION OF THE RELATED ARTS

Traditional wired connection does not provide enough bandwidth for mass data transmission, so optical connection is introduced with photon in place of electron. Although a high-definition multimedia wire interface having a 10 Gb/s data transmission rate is found in the market, its fabrication procedure is complex and its usage has a limit in distance, not more than 5 meters. Such a wired connection is not fully fit for connecting a project and a computer. On the contrary, multimode fiber can be easily connected with each other through aligned welding. Furthermore, fiber is not affected by electromagnetic wave on transmitting data and has high reliability and low transmission waste with flat modulation frequency response. Hence, fiber is fit for communication below 100 meters.

For parallel optical connection, a small and low-power-consumption device is required. Monolithically integrated light source emitter and receiver is a solution for reducing production cost and low transmission waste. Yet, such a solution requires a highly modulated laser source. VCSEL, as revealed in "Room-temperature continuous wave lasing characteristics of a GaAs vertical-cavity surf ace-emitting laser, "Appl. Phys. Lett. Vol. 55, 221-222, 1989, by Koyama et al, has a low threshold current, a single longitudinal mode and less scattered beams; and has thus become an important laser source for fiber communications and optical storage systems. The VCSEL having a stable single mode is especially useful with its operations both on single longitudinal mode and single transverse mode. It is because, for a high-speed long-distance fiber communication system, the single mode VCSEL can solve the dispersion problem of light wave transmission; for a wavelength multitasking system, interferences between different channels can be avoided; and, for optical storage and printing system, a single dot required for the system is provided. Hence, a single-mode VCSEL is introduced, which uses a proper zinc-diffused fabrication depth to limit other modes for low power consumption, high speed and high linearity.

Photodiode is a device for transforming optical signals into electronic signals; and, therefore, a high-speed photodiode is aimed at its response ratio and quantum efficiency. Regarding applying optical connection, a high-density VCSEL array requires a coordination of an easy-coupled and high-density optical detector array, so vertical incident optical detectors are better choices than the other types of detectors. However, general detectors require outside reverse bias to maintain high-speed operation and so extra power consumption and bias circuit are required.

A general positive-intrinsic-negative (PIN) photodiode has a thin depletion layer as an intrinsic layer between a p-type layer and an n-type layer. The depletion layer is an absorption layer for absorbing inlet light and exciting electron-hole pairs. The electrons and holes are accelerated by the electric field in the depletion layer to enter into the p-type layer and the n-type layer for forming photocurrent. But, because the holes are slower than the electrons and are thus accumulated at the intrinsic layer to form electric field shielding effect with inner electric field reduced, carriers are thus getting slow and power output is affected. Although a thicker depletion layer may reduce the limitation on RC bandwidth, carriers may drift too long and response speed may become too slow. On the contrary, a thinner depletion layer shortens the drifting time of the carriers and increases a saturation current, yet capacitance is thus become bigger with reduced bandwidth and quantum efficiency. Besides, because the equivalent mass of the holes are heavy, these kinds of devices have to be operated with outside bias above −3 volts for accelerating holedrift. As a conclusion, if the traditional PIN photodiode is operated without outside bias, the drifting speed of the holes will be too slow owing to the low electric field in the intrinsic; and the whole device will become very slow as well. But, if the built-in electric field is to be enlarged, the width (electrical field inside) of depletion layer will be increased and absorption efficiency will be thus greatly reduced.

In addition, regarding a UTC-PD, it has a p-type narrow-band-gap absorption layer and a wide-band-gap collector layer. Because the p-type absorption layer has a quasi-neutrality and its carriers (i.e. holes) are relaxed into contact metal, electrons become the only source of operational charge and a transient time of the UTC-PD is decided by the transit time of the electrons (including time for passing through a transport Layer and the absorption layer). Although UTC-PD made of InGaAs—InP is widely used for optical communication on 1550 nm band, a photodiode made of InP operated on 850 nm band still absorbs quite big energy; and unwanted electron-hole pairs are thus gathered at a collector. The holes stayed at the absorption layer will cause effect of space electric field and, thus, the speed of the device will be lowered.

In a word, there is still no optoelectronic device found with zero bias, high speed and low power consumption. Hence, the prior arts do not fulfill all users' requests on actual use.

SUMMARY OF THE DISCLOSURE

The main purpose of the present disclosure is to provide an optoelectronic device with a high-velocity UTC-PD and a zinc-diffused VCSEL integrated for high velocity and low power consumption.

To achieve the above purpose, the present disclosure is an optoelectronic device having light source emitter and receiver integrated, comprising a substrate, a light source emitting module, a semi-insulating layer and a light source receiving module, where the light source emitting module comprises an n-distributed bragg reflector (n-DBR) on the substrate, an active region on the n-DBR, a p-distributed bragg reflector (p-DBR) on the active region, an oxide layer, a zinc diffused region, an insulation layer, an n-type contact, a p-type contact, an n-type metal pad on the insulation layer and a p-type metal pad on the insulation layer; the light source receiving module comprises an etching stop layer, a buffer layer, an n-type ohmic contact layer, an electron transporting layer, a graded layer, a setback layer, an absorption layer, a diffusion block layer and a p-type ohmic contact layer; the oxide layer has a first aperture and is located above the active region in the p-DBR; the zinc diffused region has a second aperture and is located above the oxide layer in the p-DBR; the insulation layer has a light source emitting aperture and extends on the zinc diffused region from two ends of the light source emitting aperture to penetrate through the active region and the p-DBR into the n-DBR; the oxide layer and the zinc diffused region is located in a region defined by the two extended ends of the insulation layer; the light source emitting aperture has a center aligning to a center of the first aperture and a center of the second aperture; the n-type contact is located in the insulation layer between the insulation layer and the n-DBR; the p-type contact is located in the insulation layer between the insulation layer and the zinc diffused region; the n-type metal pad is electrically contacted with the n-type contact through a penetrating hole in the insulation layer; the p-type metal pad is electrically contacted with the p-type contact through a penetrating hole in the insulation layer; the semi-insulating layer is deposed on the light source emitting module; the light source receiving module is deposed on the semi-insulating layer to obtain a positive-intrinsic-negative (PIN) structure; the etching stop layer is a non-doped first semiconductor located on the semi-insulating layer; the buffer layer is a non-doped second semiconductor located on the etching stop layer; the n-type ohmic contact layer is an n-type doped third semiconductor located on the buffer layer; the n-type ohmic contact layer has an n-type metal conducting layer; the electron transporting layer is a non-doped fourth semiconductor located on the n-type ohmic contact layer; the graded layer is a non-doped fifth semiconductor located on the electron transporting layer; the setback layer is a non-doped sixth semiconductor located on the graded layer; the absorption layer is a p-type doped seventh semiconductor located on the setback layer; the diffusion block layer is a p-type doped eighth semiconductor located on the absorption layer; the p-type ohmic contact layer is a p-type doped ninth semiconductor located on the diffusion block layer; and the p-type ohmic contact layer has a p-type metal conducting layer. Accordingly, a novel optoelectronic device integrating light source emitter and receiver is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the cross-sectional view showing the preferred embodiment according to the present disclosure;

DESCRIPTION OF THE PREFERRED EMBODIMENT

Figure 1:
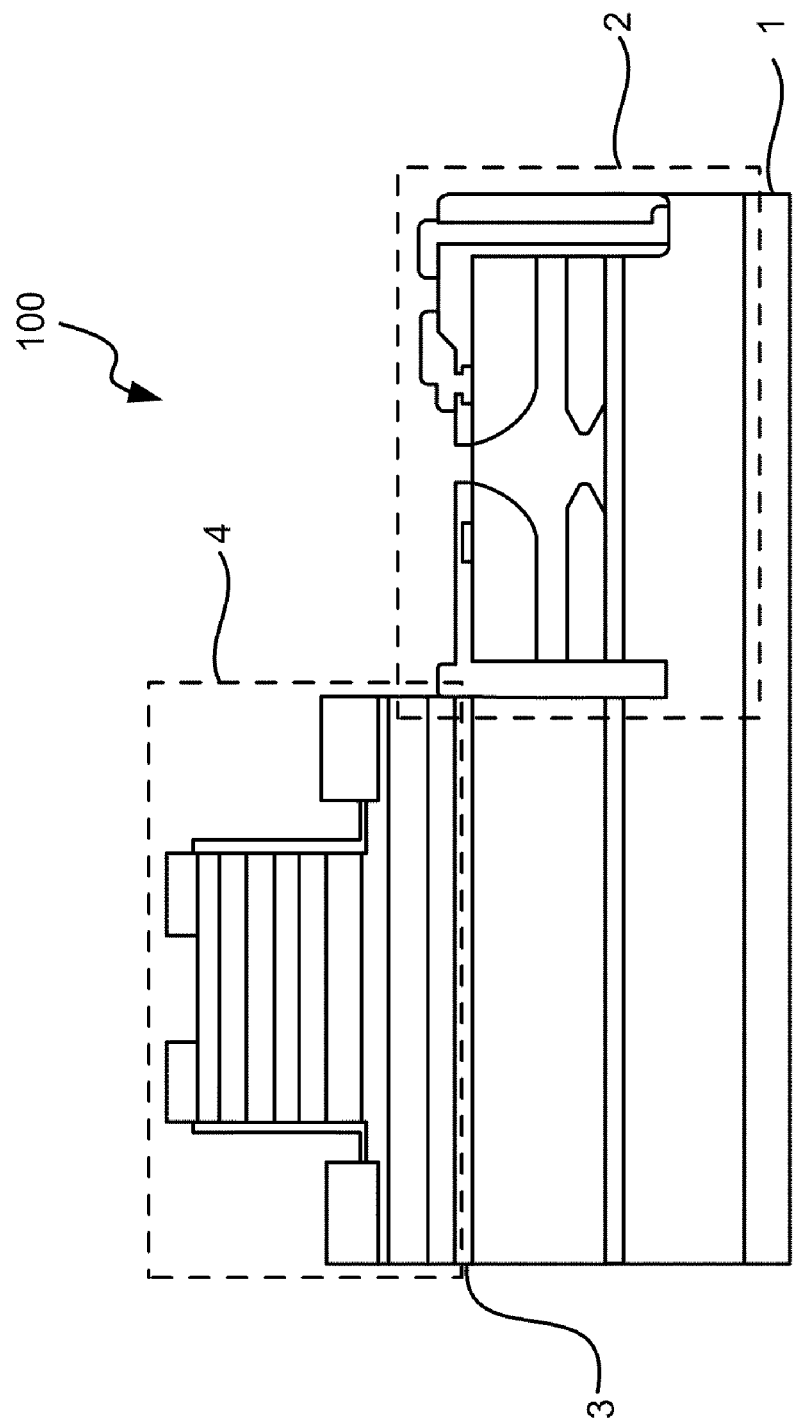
Figure 2:
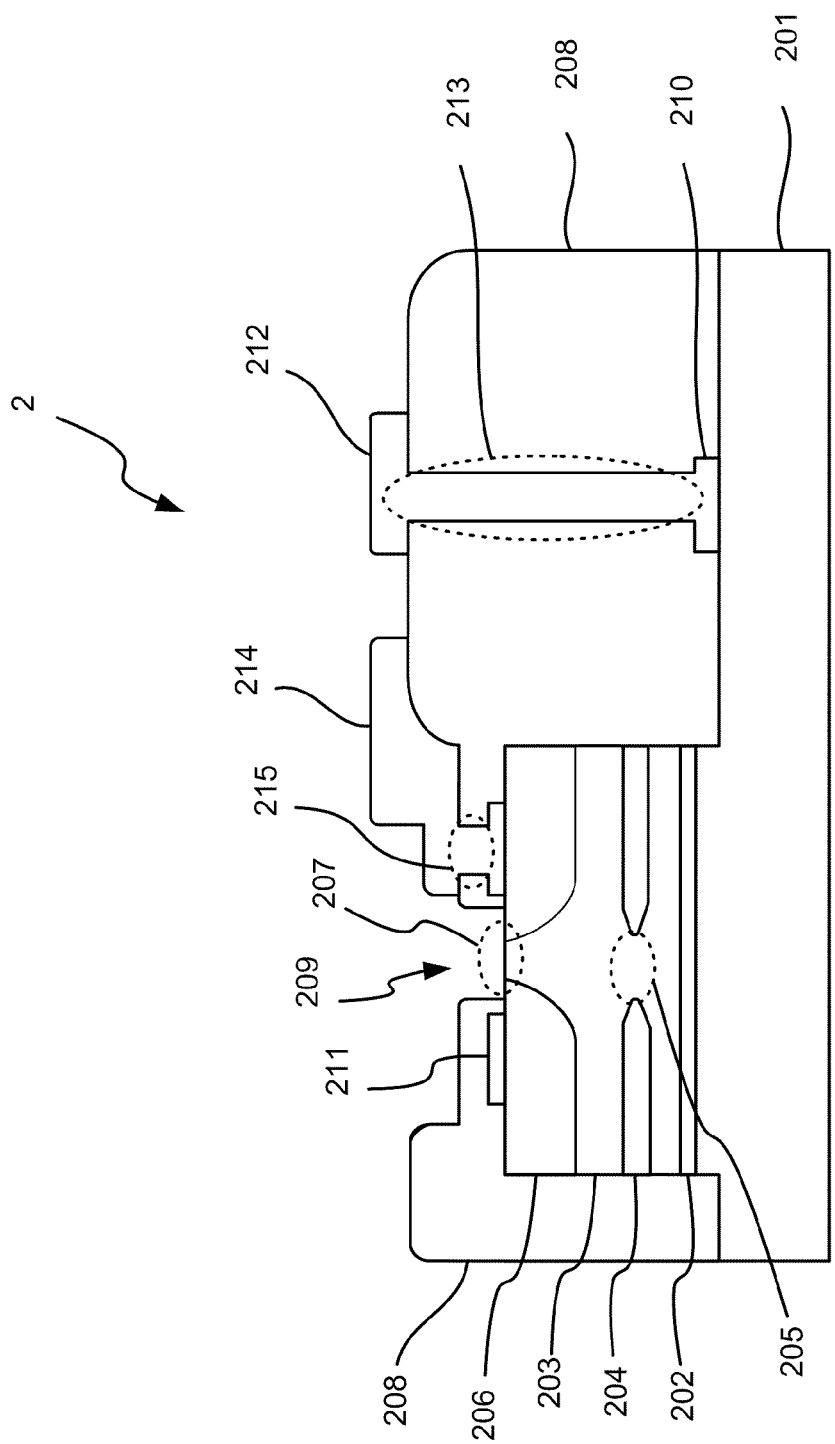
FIG. 2 is the cross-sectional view showing the light source emitting module.
Figure 3:
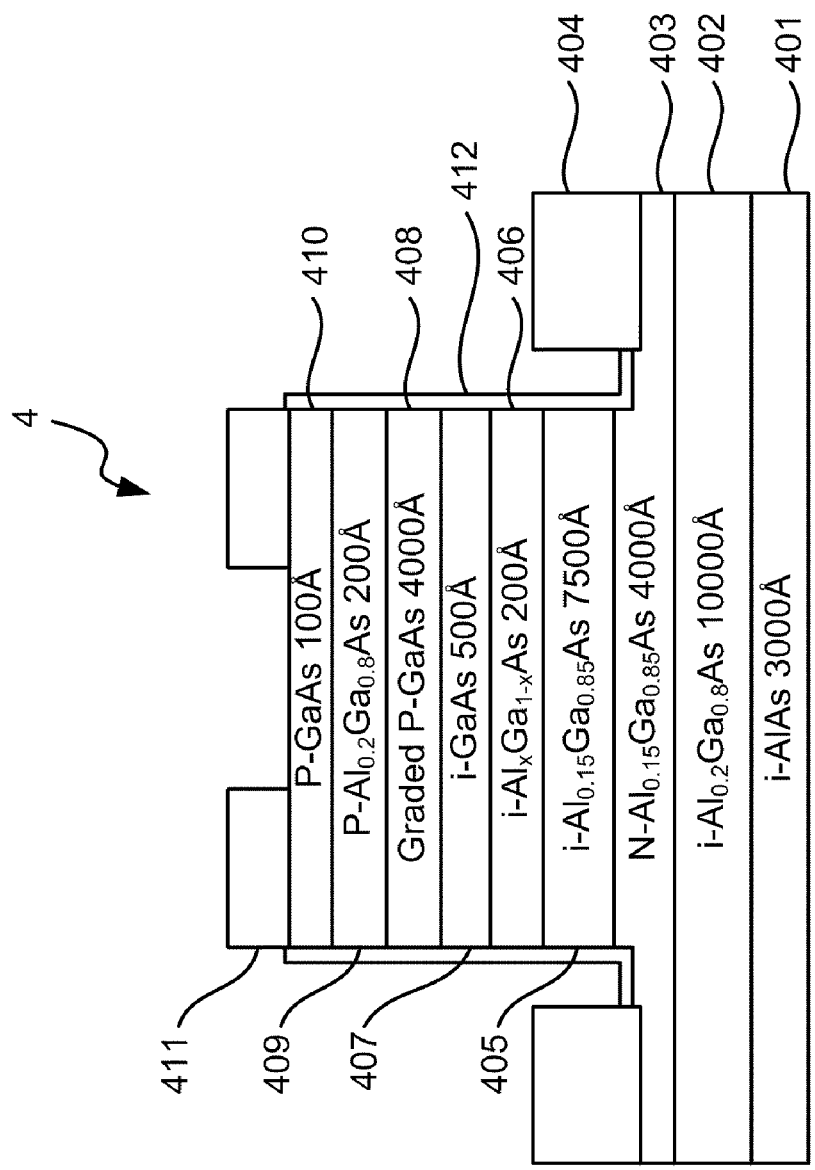
FIG. 3 is the cross-sectional view showing the light source receiving module.

The following description of the preferred embodiment is provided to understand the features and the structures of the present disclosure.

Please refer to FIG. 1 to FIG. 4, which are cross-sectional views showing a preferred embodiment, a light source emitting module and a light source receiving module according to the present disclosure; and a view showing a state of use of the preferred embodiment. As shown in the figures, the present disclosure is an optoelectronic device having light source emitter and receiver integrated 100, comprising a substrate 1, a light source emitting module 2, a semi-insulating layer 3 and a light source receiving module 4, where the above components are integrated in a single chip for limiting light and current by zinc diffusion and hydrous oxidation to obtain an optoelectronic device having a high velocity and a low power consumption.

The light source emitting module 2 is a vertical cavity surface-emitting laser (VCSEL), comprising an n-distributed bragg reflector 201 (n-DBR) stacked on the substrate 1; an active region 202 formed on the n-DBR 201; a p-distributed bragg reflector 203 (p-DBR) stacked on the active region 202; an oxide layer 204; a zinc diffused region 206; an insulation layer 208 made of bisbenzocyclobutene (BOB); an n-type contact 210; a p-type contact 211; an n-type metal pad 212 formed on the insulation layer 208; and a p-type metal pad 214 formed on the insulation layer 208. Therein, the oxide layer 204 has a first aperture 205, is located above the active region 202, and is buried into the p-DBR 203; the zinc diffused region 206 has a second aperture 207, is located above the oxide layer 204, and is buried into the p-DBR 203; the insulation layer 208 has a light source emitting aperture 209; the insulation layer 208 extends from two ends of the light source emitting aperture 209 on the zinc diffused region 206 to penetrate through the active region 202 and the p-DBR 203 into the n-DBR 201; the oxide layer 204 and the zinc diffused region 206 is located in a region defined by the two extended ends of the insulation layer 208; the light source emitting aperture 209 has a center aligned to a center of the first aperture 205 and a center of the second aperture 207; the n-type contact 210 is buried in the insulation layer 208 and is located between the insulation layer 208 and the n-DBR 201; the p-type contact 211 is buried in the insulation layer 208 and is located between the insulation layer 208 and the zinc diffused region 206; the n-type metal pad 212 is electrically connected with the n-type contact 210 through a penetrating hole 213 in the insulation layer 208; and, the p-type metal pad 214 is electrically connected with the p-type contact 211 through a penetrating hole 215 in the insulation layer 208.

The light source receiving module 4 is a uni-traveling-carrier photodiode (UTC-PD) formed on the light source emitting module 2 to obtain a positive-intrinsic-negative (PIN) structure with a semi-insulating layer 3 in between. The light source receiving module 4 comprises an etching stop layer 401 on the semi-insulating layer 3; a buffer layer 402 on the etching stop layer 401; an n-type ohmic contact layer 403 on the buffer layer 402; an electron transporting layer 405 on the n-type ohmic contact layer 403; a graded layer 406 on the electron transporting layer 405; a setback layer 407 on the graded layer 406; an absorption layer 408 on the setback layer 407; a diffusion block layer 409 on the absorption layer 408; a p-type ohmic contact layer 410 on the diffusion block layer 409; and a lateral protective layer 412. Therein, the etching stop layer 401 is a non-doped semiconductor for selective-etching; the buffer layer 402 is a non-doped semiconductor for limiting optic modes in the absorption layer 208 and for isolating carriers generated from the light source emitting module 2 by p-type doping; the n-type ohmic contact layer 403, having an n-type metal conducting layer 404, is an n-type doped semiconductor as an n-type electrode; the electron transporting layer 405 is a non-doped semiconductor for reducing capacitance; the graded layer 406 is a non-doped semiconductor for freeing electron drift; the setback layer 407 is a non-doped semiconductor for preventing p-type doping material from diffusing into non-doped area; the absorption layer 408 is a p-type doped semiconductor for absorbing inlet light to obtain carriers transformed; the diffusion block layer 409 is a p-type doped semiconductor for preventing electron from diffusing into p-type doped area; the p-type ohmic contact layer 410, having a p-type metal conducting layer 411, is a p-type doped semiconductor as a p-type electrode; and, the lateral protective layer 412 is made of the same material as that for the insulation layer 208 of the light source emitting module 2.

The first aperture 205 has a diameter size between 6 micrometers (μm) and 7 μm, which is bigger than that of the second aperture 208 (5-6 μm); and, a distance between the two extended ends of the insulation layer 208 is 42 μm to 45 μm. Therein, the oxide layer 204 is located above the active region 202 but is not contacted with the active region 202; the zinc diffused region 206 is located above the oxide layer 204 but is not contacted with the oxide layer 204; and, the active region 202 has a single quantum well structure or a multi-quantum well structure. In the light source receiving module 4, the etching stop layer 401 is made of non-doped aluminum arsenide (AlAs); the buffer layer 402 is made of non-doped aluminum gallium arsenide (AlGaAs); the n-type ohmic contact layer 403 is made of n-type doped AlGaAs; the electron transporting layer 405 is made of non-doped AlGaAs; the graded layer 406 is made of non-doped AlGaAs; the setback layer 407 is made of non-doped gallium arsenide (GaAs); the absorption layer 408 is made of p-type doped GaAs; the diffusion block layer 409 is made of p-type doped AlGaAs; and the p-type ohmic contact layer 410 is made of p-type doped GaAs.

Figure 4:
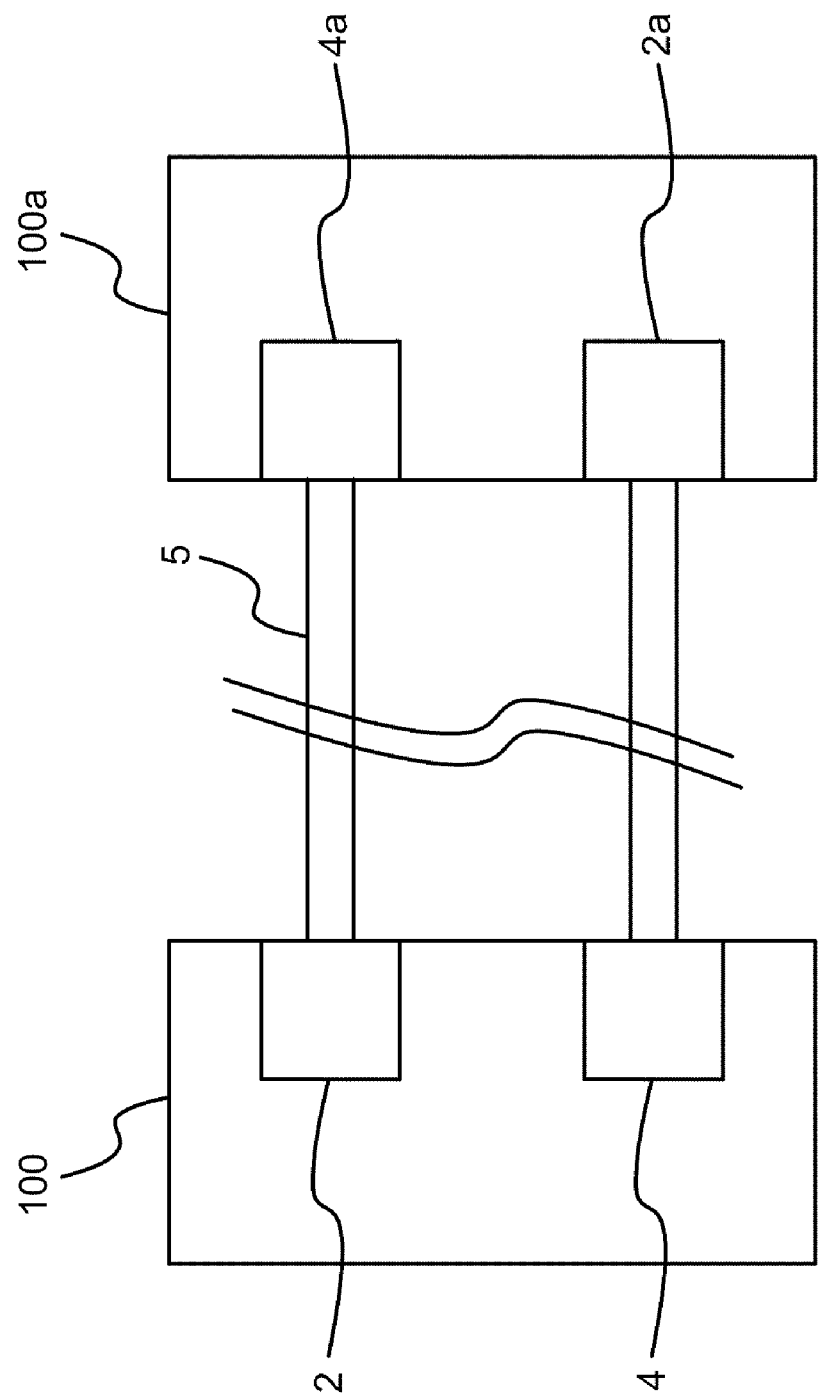
FIG. 4 is the view showing the state of use of the preferred embodiment.

The second aperture 207 of the optoelectronic device 100 has a 5 μm diameter; the first aperture 205, a 6 μm diameter; and the two extended ends of the insulation layer 208, a 42 μm width. The first aperture 205 is used to limit current for heightening current density and lowering threshold current. With the zinc diffused region 206, a series resistance of the optoelectronic device 100 is effectively reduced for lowering an operational voltage. As shown in FIG. 4, on using the present disclosure, the light source emitting module 2 and the light source receiving module 4 of the optoelectronic device 100 are connected with another light source receiving module 4a and another light source emitting module 2a of another optoelectronic device 100a through two fibers 5, respectively.

The present disclosure is obtained by growing structures of VCSEL and UTC-PD on a substrate, where UTC-PD is grown on VCSEL with a semi-insulating layer in between for avoiding noise generated from unnecessary current.

Figure 5A:
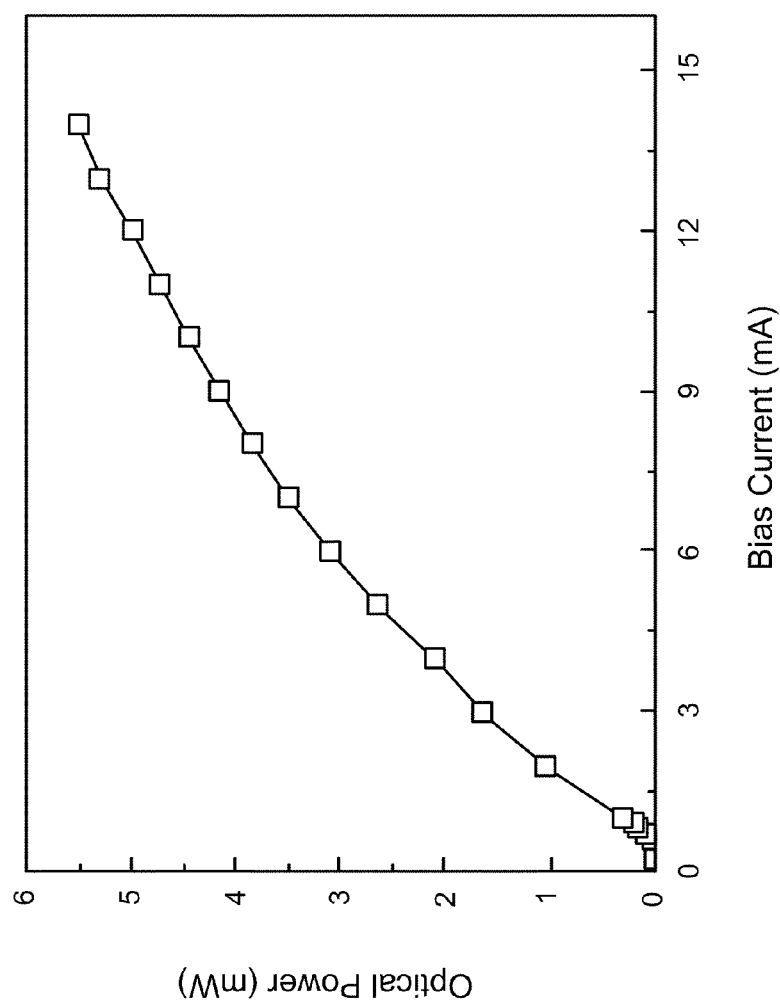
FIG. 5A is the view showing the curve of current to optical power output.
Figure 5B:
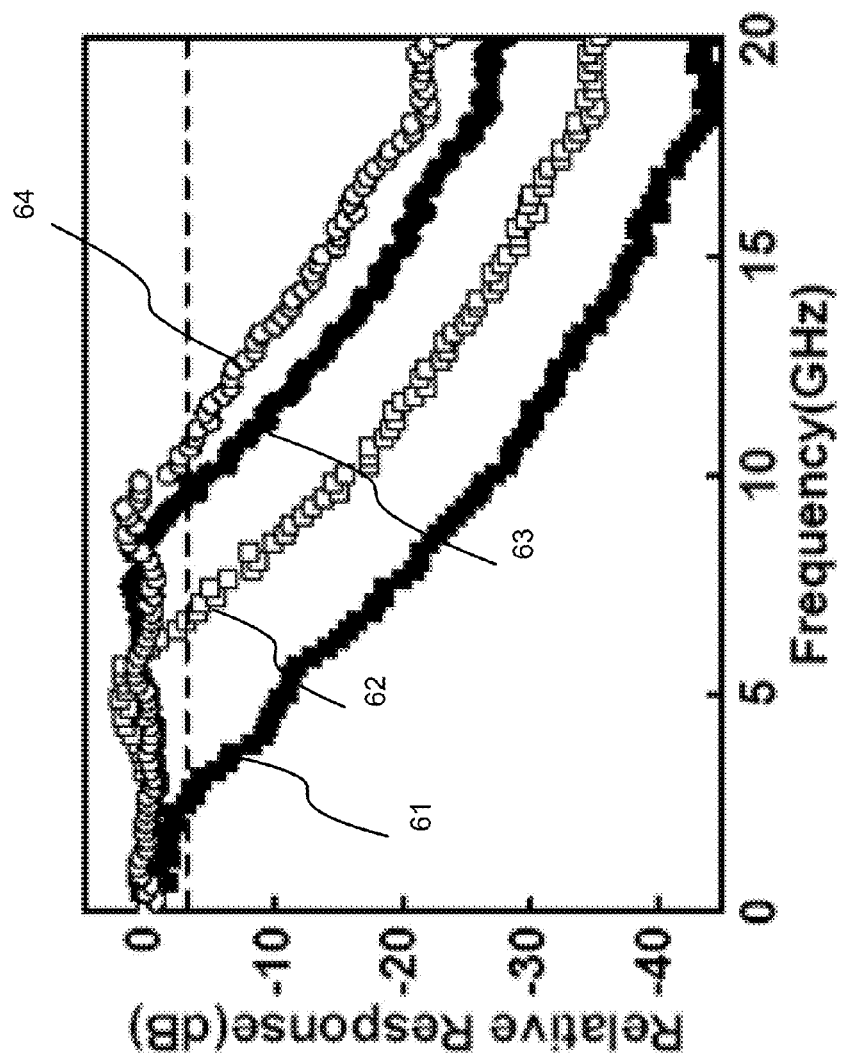
FIG. 5B is the view showing the bandwidth of the VCSEL.

Please refer to FIG. 5A and FIG. 5B, which are views showing a curve of current to optical power output; and bandwidths of the VCSEL. As shown in the figures, a threshold current of an optoelectronic device is about 0.8 milli-amperes (mA) with a biggest power of 5.5 milli-watts (mW) and a differential quantum efficiency of 80%. As shown in FIG. 5A, since the present disclosure has a low threshold current with high differential quantum efficiency, a small threshold current is thus obtained with saved power for high-speed performance. As shown in FIG. 5B, through the bandwidth curves 61~64 under 1 mA, 2 mA, 4 mA and 6 mA, it is proved that a frequency response with 3 dB bandwidth at 10 GHz can be obtained with the present disclosure under a very low photocurrent.

One embodiment of the present invention preferably results in eye diagrams under 10 Gb/s and 12.5 Gb/s. Through VCSEL combined, eye diagrams under 10 Gb/s and 12.5 Gb/s with small operational currents of 3 mA and 6 mA are obtained. In the eye diagrams, heights and widths of the eyes are separately (266 mV, 72 ps) and (233 mV, 67 ps), where the eyes are clearly opened with a good data transmission performance. Thus, with low threshold current and high differential quantum efficiency, the present disclosure obtains a 10 GHz bandwidth under a small operational current to open an eye diagram under 10 Gb/s for high velocity and low power consumption.

Figure 6:
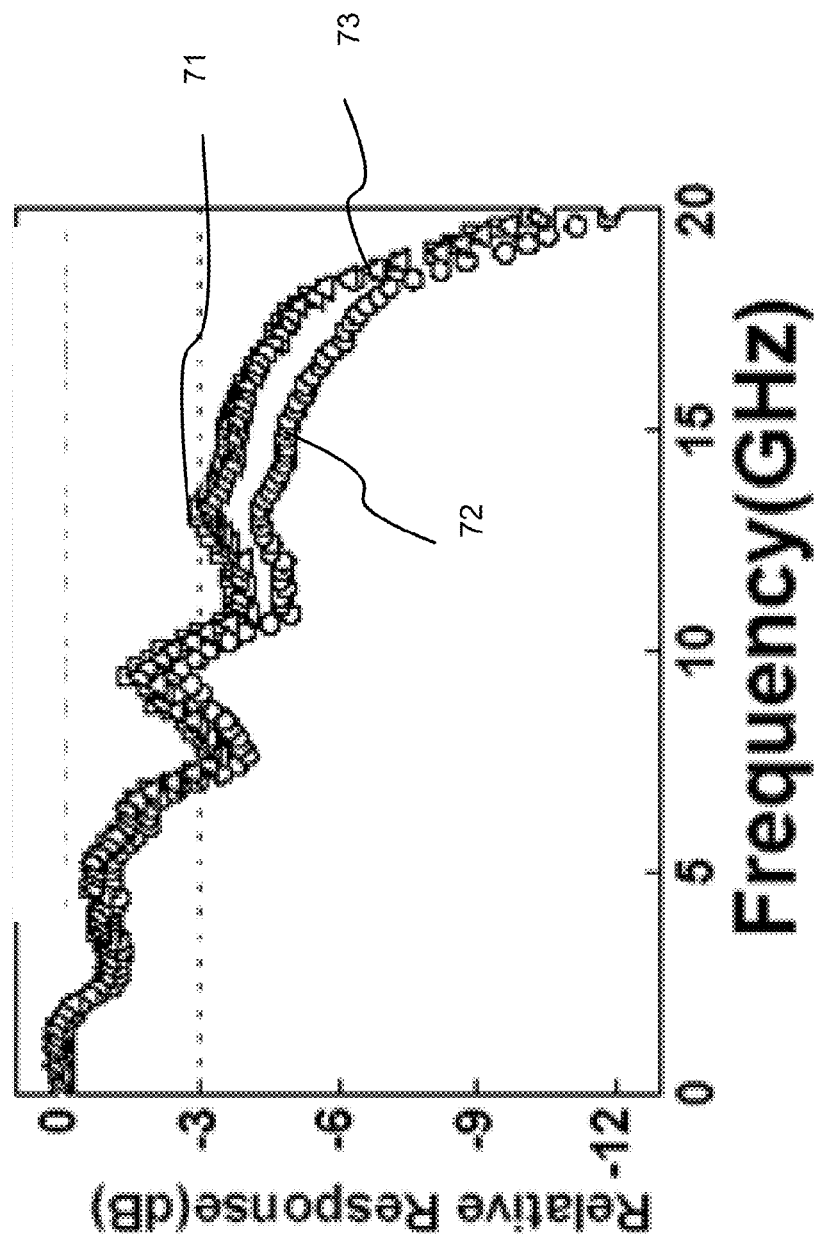
FIG. 6 is the view showing the bandwidth curve of the fixed photocurrents of the UTC-PD

Please refer to FIG. 6, which is a view showing a bandwidth curve of fixed photocurrents of a UTC-PD. As shown in the figure, frequency responses of the UTC-PD under 0.42 mA with various biases are measured. The bandwidth curves 71~73 under 0V, −3V and −5V are all maintained at 10 GHz 3 dB bandwidth. It shows that the present disclosure obtains the same frequency responses with or without outside bias, which is not sensitive to outside bias.

An embodiment of the present invention preferably results in eye diagrams of the integrated UTC-PD under 10 Gb/s with a low photocurrent and a high photocurrent. UTC-PD is integrated in the present disclosure to be operated without bias and to obtain eye diagrams with various photocurrents. All eyes are clearly opened, no matter for a low photocurrent (0.1 mA), or for a high photocurrent (0.4 mA). Even with a low photocurrent, and even 0 bias, a 10 Gb/s eye diagram is opened clearly and widely.

The present disclosure integrates a high-speed UTC-PD and a zinc-diffused VCSEL, where the VCSEL has a high ratio of data transmission to power consumption; and the UTC-PD can be operated without outside bias. Thus, the present disclosure can be applied in optical connection for bi-directional transmission, where quantum efficiency of the integrated UTC-PD reaches 46.7% with a high 3 dB bandwidth (13 GHz); and 10 Gb/s eye diagrams are opened under zero-bias with a photocurrent no matter low or high (0.1-0.4 mA). About the integrated VCSEL, a 10 Gb/s eye diagram can be opened with a very low operational voltage and few high-frequency signal for alternating modulation.

To sum up, the present disclosure is an optoelectronic device having light source emitter and receiver integrated, where a single chip is obtained on a substrate with VCSEL and UTC-PD integrated; the VCSEL opens a 10 Gb/s eye diagram with a small operational voltage and a small signal amplitude; the UTC-PD passes a 10 Gb/s eye diagram without outside bias; and the present disclosure thus obtains low power consumption and high speed.

The preferred embodiment(s) herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. An optoelectronic device having light source emitter and receiver integrated, comprising
   (a) a substrate;
   (b) a light source emitting module, said light source emitting module comprising
      (b0) an n-distributed bragg reflector (n-DBR), said n-DBR being deposed on said substrate;
      (b1) an active region, said active region being deposed on said n-DBR;
      (b2) a p-distributed bragg reflector (p-DBR), said p-DBR being deposed on said active region;
      (b3) an oxide layer, said oxide layer having a first aperture, said oxide layer being located above said active region, said oxide layer being located in said p-DBR;
      (b4) a zinc diffused region, said zinc diffused region having a second aperture, said zinc diffused region being located above said oxide layer, said zinc diffused region being located in said p-DBR;
      (b5) an insulation layer, said insulation layer having a light source emitting aperture, said insulation layer extending from two ends of said light source emitting aperture on said zinc diffused region to penetrate through said active region and said p-DBR into said n-DBR, wherein said oxide layer and said zinc diffused region is located in a region defined by said two extended ends of said insulation layer; and wherein said light source emitting aperture has a center aligned to a center of said first aperture and a center of said second aperture;

(b6) an n-type contact, said n-type contact being located in said insulation layer, said n-type contact being located between said insulation layer and said n-DBR;

(b7) a p-type contact, said p-type contact being located in said insulation layer, said p-type contact being located between said insulation layer and said zinc diffused region;

(b8) an n-type metal pad, said n-type metal pad being deposed on said insulation layer, said n-type metal pad being electrically contacted with said n-type contact through a penetrating hole in said insulation layer; and (b9) a p-type metal pad, said p-type metal pad being deposed on said insulation layer, said p-type metal pad being electrically contacted with said p-type contact through a penetrating hole in said insulation layer;

(c) a semi-insulating layer, said semi-insulating layer being deposed on said light source emitting module; and (d) a light source receiving module, said light source receiving module being deposed on said semi-insulating layer to obtain a positive-intrinsic-negative (PIN) structure, said light source receiving module comprising (d0) an etching stop layer, said etching stop layer being a non-doped semiconductor located on said semi-insulating layer;

(d1) a buffer layer, said buffer layer being a non-doped semiconductor located on said etching stop layer;

(d2) an n-type ohmic contact layer, said n-type ohmic contact layer being an n-type doped buffer layer, said n-type ohmic contact layer having an n-type metal conducting layer;

(d3) an electron transporting layer, said electron transporting layer being a non-doped semiconductor located on said n-type ohmic contact layer;

(d4) a graded layer, said graded layer being a non-doped semiconductor located on said electron transporting layer;

(d5) a setback layer, said setback layer being a non-doped semiconductor located on said graded layer;

(d6) an absorption layer, said absorption layer being a p-type doped semiconductor located on said setback layer;

(d7) a diffusion block layer, said diffusion block layer being a p-type doped semiconductor located on said absorption layer; and (d8) a p-type ohmic contact layer, said p-type ohmic contact layer being a p-type doped semiconductor located on said diffusion block layer, said p-type ohmic contact layer having a p-type metal conducting layer.

2. The device according to claim 1, wherein said insulation layer is made of bisbenzocyclobutene (BCB).

3. The device according to claim 1, wherein said light source emitting module is a vertical cavity surface-emitting laser (VCSEL).

4. The device according to claim 1, wherein said first aperture has a diameter bigger than said diameter of said second aperture.

5. The device according to claim 1, wherein said first aperture has a diameter between 6 micrometers (μm) and 7 μm.

6. The device according to claim 1, wherein said second aperture has a diameter between 5 μm and 6 μm.

7. The device according to claim 1, wherein a distance between said two extended ends of said insulation layer is 42 μm to 45 μm.

8. The device according to claim 1, wherein said oxide layer is located above said active region and is not contacted with said active region.

9. The device according to claim 1, wherein said zinc diffused region is located above said oxide layer and is not contacted with said oxide layer.

10. The device according to claim 1, wherein said light source receiving module is a uni-traveling-carrier photodiode (UTC-PD).

11. The device according to claim 1, wherein said light source receiving module further comprises a lateral protective layer.

12. The device according to claim 1, wherein said active region has a structure selected from a group consisting of a single quantum well structure and a multiquantum well structure.

13. The device according to claim 1, wherein, in said light source receiving module,
said etching stop layer is made of non-doped aluminum arsenide (AlAs);
said buffer layer is made of non-doped aluminum gallium arsenide (AlGaAs);
said n-type ohmic contact layer is made of n-type doped AlGaAs;
said electron transporting layer is made of non-doped AlGaAs;
said graded layer is made of non-doped AlGaAs;
said setback layer is made of non-doped gallium arsenide (GaAs);
said absorption layer is made of p-type doped GaAs;
said diffusion block layer is made of p-type doped AlGaAs; and
said p-type ohmic contact layer is made of p-type doped GaAs.

* * * * *